United States Patent
Sun et al.

(10) Patent No.: US 6,372,668 B2
(45) Date of Patent: *Apr. 16, 2002

(54) METHOD OF FORMING SILICON OXYNITRIDE FILMS

(75) Inventors: Sey-Ping Sun; Homi Nariman, both of Austin, TX (US); Hartmut Ruelke, Dresden (DE)

(73) Assignee: Advanced Micro Devices, Inc., Austin, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/484,603

(22) Filed: Jan. 18, 2000

(51) Int. Cl.$^7$ .......................... H01L 21/31; H01L 21/469
(52) U.S. Cl. .......................... 438/786; 438/769
(58) Field of Search .......................... 438/786, 778, 438/636, 676, 792, 769

(56) References Cited

U.S. PATENT DOCUMENTS

| | | | | |
|---|---|---|---|---|
| 4,668,365 A | * | 5/1987 | Foster et al. | 204/192.25 |
| 5,300,460 A | * | 4/1994 | Collins et al. | 438/712 |
| 5,387,535 A | | 2/1995 | Wilmsmeyer | 437/57 |
| 5,391,520 A | | 2/1995 | Chen et al. | 437/200 |
| 5,453,400 A | | 9/1995 | Abernathey et al. | 437/192 |
| 5,489,797 A | | 2/1996 | Chan et al. | 257/382 |
| 5,516,726 A | | 5/1996 | Kim et al. | 437/189 |
| 5,521,106 A | | 5/1996 | Okabe | 437/41 |
| 5,563,096 A | | 10/1996 | Nasr | 437/186 |
| 5,589,415 A | | 12/1996 | Blanchard | 437/57 |
| 5,591,494 A | * | 1/1997 | Sato et al. | 427/579 |
| 5,621,232 A | | 4/1997 | Ohno | 257/288 |
| 5,621,235 A | | 4/1997 | Jeng | 257/384 |
| 5,928,732 A | * | 7/1999 | Law et al. | 427/579 |
| 5,968,324 A | * | 10/1999 | Cheung et al. | 204/192.28 |
| 6,030,541 A | * | 2/2000 | Adkisson et al. | 216/51 |
| 6,040,022 A | * | 3/2000 | Chang et al. | 427/579 |
| 6,060,404 A | * | 5/2000 | Ngo et al. | 438/778 |
| 6,083,852 A | * | 7/2000 | Cheung et al. | 438/791 |
| 6,124,217 A | * | 9/2000 | Sun et al. | 438/778 |
| 6,127,262 A | * | 10/2000 | Huang et al. | 438/634 |
| 6,235,650 B1 | * | 5/2001 | Yao | 438/786 |

FOREIGN PATENT DOCUMENTS

| | | | | |
|---|---|---|---|---|
| EP | 0 661 732 A2 | | 7/1995 | H01L/21/316 |
| JP | 62076537 A | * | 4/1987 | 21/88 |
| JP | 01019760 | | 1/1989 | H01L/27/14 |
| JP | 04162428 A | * | 6/1992 | 21/318 |
| WO | WO 97/18585 | | 5/1997 | H01L/21/768 |

OTHER PUBLICATIONS

IBM Technical Disclosure Bulletin, "XP–002071606—Oxide–Nitride Dual Insulator Process for Memory Metallization; Large–Small Via Etch Sequence," vol. 23, No. 7B, Dec. 1980.

* cited by examiner

Primary Examiner—Charles Bowers
Assistant Examiner—Brook Kebede
(74) Attorney, Agent, or Firm—Williams, Morgan & Amerson, P.C.

(57) ABSTRACT

The present invention is directed to a method of forming process layers comprised of silicon oxynitride. In one embodiment, the method comprises positioning a wafer in a process chamber, introducing silane and nitrous oxide into the chamber at a flow rate ratio ranging from approximately 2.6–3.8 silane to nitrous oxide, and generating a plasma in the chamber using a high frequency to low frequency power setting ratio ranging from approximately 1.2–1.8.

14 Claims, 2 Drawing Sheets

METHOD OF FORMING SILICON OXYNITRIDE FILMS

BACKGROUND OF THE INVENTION

1. Field of the Invention

The present invention is generally directed to the field of semiconductor processing, and, more particularly, to an improved method for making process films comprised of silicon oxynitride.

2. Description of the Related Art

In the manufacture of semiconductor devices, process films comprised of silicon oxynitride ($SiO_xN_y$) are formed at various points during the manufacturing process. By way of example, silicon oxynitride films may be used as an etch stop layer in the formation of conductive interconnections in a semiconductor device. Such layers may also be used to form sidewall spacers adjacent a gate electrode of a semiconductor device and as a metal hard mask layer in ultraviolet photoresist patterning. Such layers are also used for other purposes not enumerated here. One such illustrative situation in which a layer of silicon oxynitride is used as an etch stop layer is depicted in FIGS. 1 and 2 of the attached drawings.

As shown in FIG. 1, a gate stack 12 comprised of a gate conductor 16 and a gate dielectric 14 are formed above a surface 11 of a semiconducting substrate 10. The gate dielectric 14 and the gate conductor 16 are typically made by forming process layers comprised of the appropriate materials above the surface 11 of the substrate 10, and patterning those layers by performing one or more etching processes to define the gate stack 12. Thereafter, the substrate 10 is subjected to a low energy ion implantation process to form lightly doped source/drain extension regions 19 in the substrate 10. Next, a plurality of sidewall spacers 22 are formed adjacent the gate stack 12 by depositing a layer of spacer material and performing one or more anisotropic etching processes to define the sidewall spacers 22. Thereafter, an additional ion implantation process is then performed to complete the formation of the source/drain regions 24 having the familiar lightly doped drain ("LDD") structure.

The fabrication of the transistor is completed by forming appropriate metal contacts through various openings in the layers of dielectric material positioned above the device. In particular, as shown in FIG. 2, a layer of silicon oxynitride 18 may be formed above the structure depicted in FIG. 1, and a dielectric layer 21 may be formed above the layer of silicon oxynitride 18. Thereafter, a plurality of openings 23 are formed in the dielectric layer 21 and the layer of silicon oxynitride 18, and conductive interconnections 25, e.g., conductive plugs, are formed therein.

During this process, the layer of silicon oxynitride 18 serves as an etch stop layer during the formation of the openings 23 in the dielectric layer 21. The material used for the dielectric layer 21 is selectively etchable with respect to the layer of silicon oxynitride 18. Without the use of the silicon oxynitride layer 18 as an etch stop, the underlying source/drain regions 24 may be damaged during the course of forming the openings 23 in the dielectric layer 21. After the openings 23 are formed in the dielectric layer 21, another etching process is performed to remove the layer of silicon oxynitride lying underneath the openings defined in the dielectric layer 21. The etching process used to remove portions of the layer of silicon oxynitride 18 has a high degree of selectivity with respect to the material comprising the dielectric layer 21 and the source/drain regions 24.

Although there are existing techniques for forming the layer of silicon oxynitride 18, the layers resulting from such known techniques or processes exhibit many problems that are detrimental to device performance and integrity. One problem associated with using known techniques for forming silicon oxynitride layers is that such techniques produce unacceptable variations in the thickness of the deposited layer. Such variations in the thickness of the silicon oxynitride layers formed using known techniques and processes may lead to unacceptable results and may create additional problems in subsequent processing operations. For example, localized variations in the thickness of a layer of silicon oxynitride may result in corresponding unevenness in a surface 29 of the dielectric layer 21, although that situation is not depicted in FIG. 2. Such surface non-uniformity may adversely impact the ability to precisely define very small feature sizes in the dielectric layer 21 using photolithographic techniques. Thus, it is very desirable to be able to produce layers of silicon oxynitride with reduced or smaller variations in thickness across the surface of the layer so that these non-uniformities do not propagate to other process layers as they are formed above the layer of silicon oxynitride.

Additionally, in semiconductor processing operations, it is generally desirable to achieve as much throughput as possible to improve yields and reduce costs. This applies equally to the formation of layers of silicon oxynitride. Thus, it is desirable to develop a method of forming layers comprised of silicon oxynitride with an acceptable range of thickness variations while at the same time insuring that deposition rates are as fast as possible to improve production and lower costs.

Another problem associated with the formation of such silicon oxynitride layers is that, in the process of forming such layers, the integrity of the gate dielectric, e.g., gate dielectric 14 in FIG. 1, may be compromised. That is, the breakdown voltage of the gate dielectric, e.g., silicon dioxide, may be reduced below acceptable limits. This in turn may lead to increases in device failure. The damage caused to such gate dielectric may be due, in part, to relatively high power densities used in plasma enhanced chemical vapor deposition processes used to form such layers.

The present invention is directed to solving, or at least reducing, some or all of the aforementioned problems.

SUMMARY OF THE INVENTION

The present invention is directed to a method of forming process layers comprised of silicon oxynitride. In one embodiment, the method comprises positioning a wafer in a process chamber, introducing silane and nitrous oxide into the chamber at a flow rate ratio ranging from approximately 2.6–3.8 silane to nitrous oxide, and generating a plasma in the chamber using a high frequency to low frequency power setting ratio ranging from approximately 1.2–1.8.

BRIEF DESCRIPTION OF THE DRAWINGS

The invention may be understood by reference to the following description taken in conjunction with the accompanying drawings, in which like reference numerals identify like elements, and in which.

Figure 1:
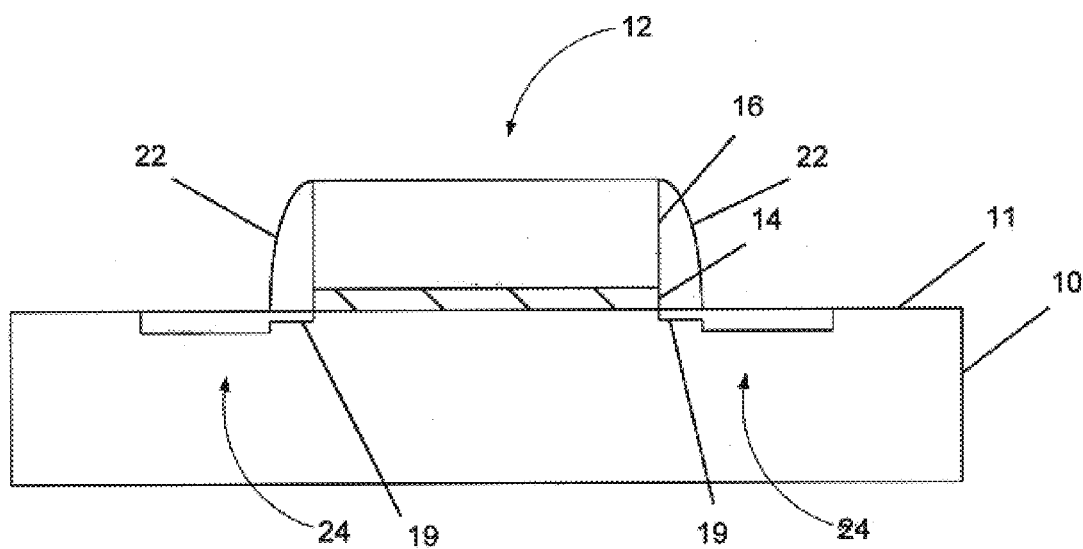
FIG. 1 is an illustrative embodiment of a partially formed prior art semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
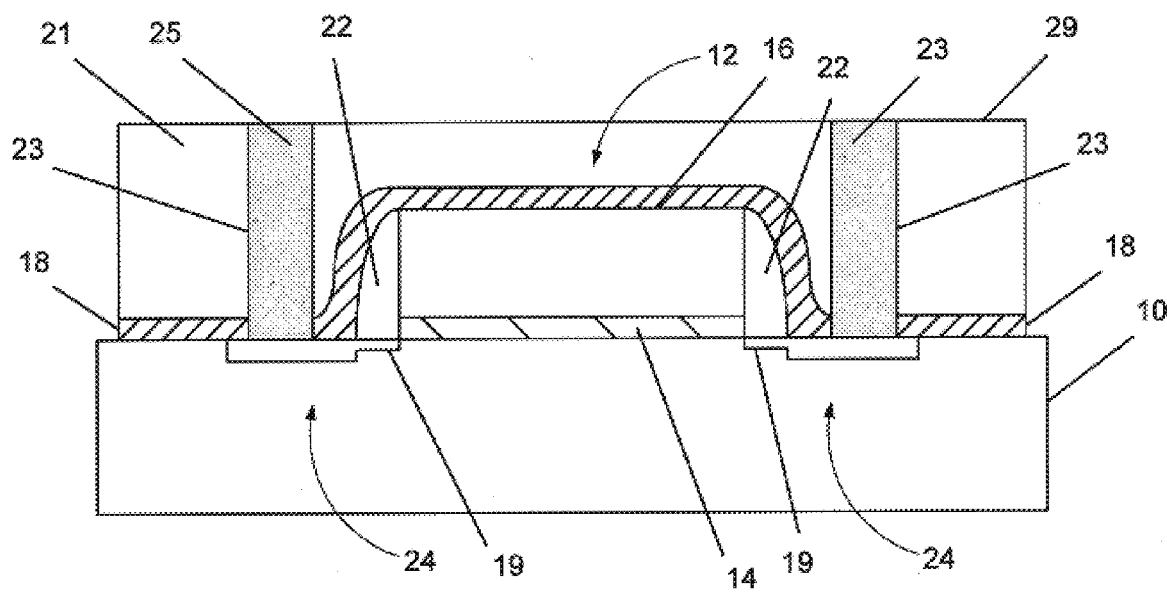
FIG. 2 is the device of FIG. 1 after a layer of silicon oxynitride and a dielectric layer have been formed above the device depicted in FIG. 1.

The present invention is directed to a method of forming process layers comprised of silicon oxynitride. In disclosing the present invention, reference may be made to the illustrative transistor depicted in FIGS. 1–2. However, the present invention should not be considered to be limited to any particular type of semiconductor device. Moreover, although the various regions and structures are depicted in the drawings as having very precise, sharp configurations and profiles, those skilled in the art recognize that, in reality, those regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to aid in obtaining an understanding of the present invention.

As will also be apparent to those skilled in the art upon a complete reading of the present application, the present invention is not limited to any particular production tool used in the course of manufacturing such oxynitride layers, and the present process may be used with either single chamber tools or multiple chamber tools. For example, the present invention has been employed with a Novellus Sequel deposition tool. The present invention may also be used with other deposition tools, although the precise processing parameters may be varied. Moreover, the present method is applicable to a variety of technologies, e.g., NMOS, PMOS, CMOS, etc., and is readily applicable to a variety of devices, including, but not limited to, logic devices, memory devices, flash memory, EPROMs, etc.

Figure 3:
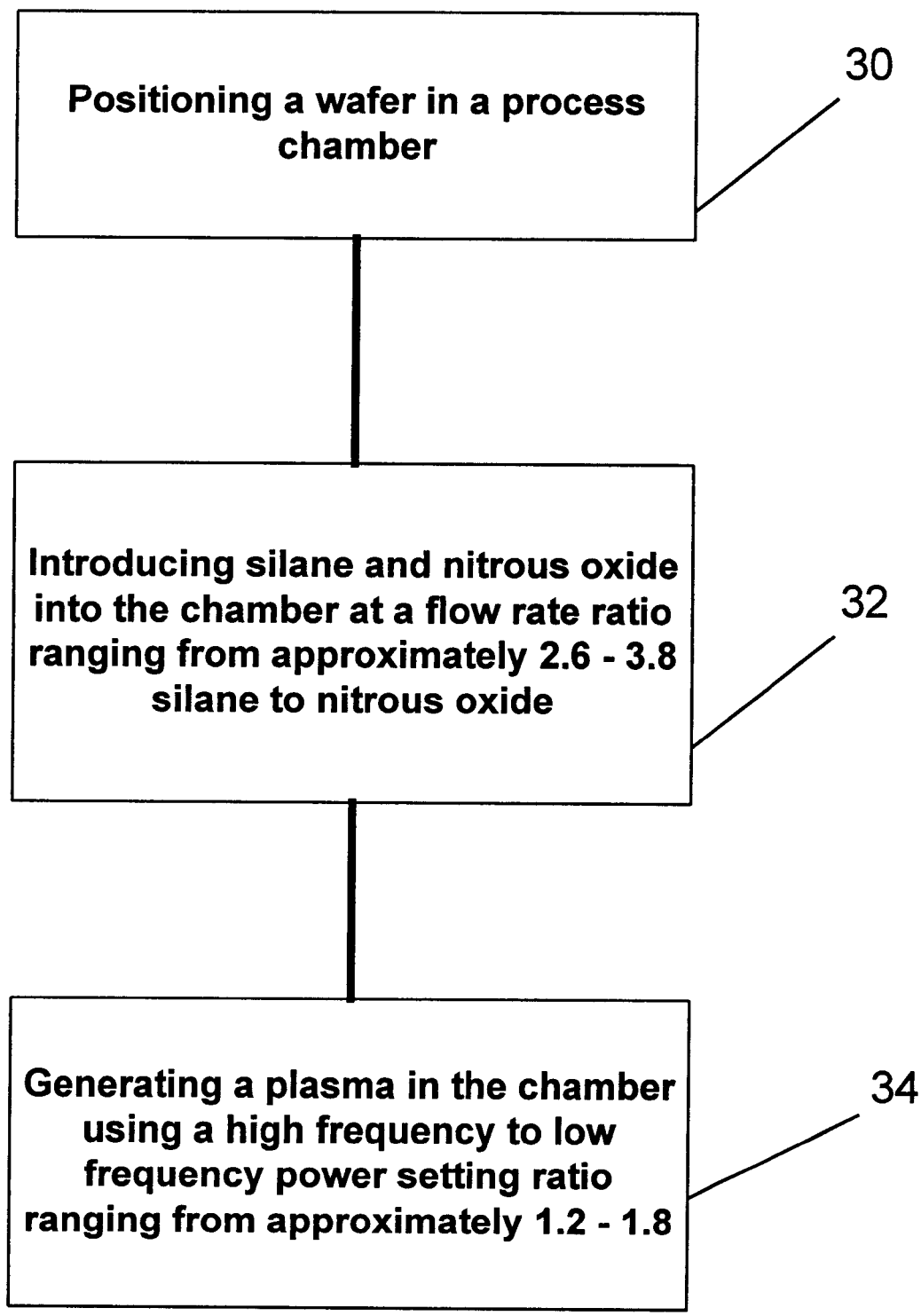
FIG. 3 is a flowchart depicting one illustrative embodiment of the present invention.

The present invention is directed to a method of forming a layer of silicon oxynitride ($SiO_xN_y$) using a plasma enhanced chemical vapor deposition ("PECVD") process that results in improved deposition rates, better layer uniformity, and increased gate dielectric reliability. As indicated in FIG. 3, one illustrative embodiment of the present invention comprises positioning a wafer into a process chamber, as indicated at block 30, introducing silane ($SiH_4$) and nitrous oxide ($N_2O$) into the process chamber at a flow rate ratio ranging from approximately 2.6–3.8 silane to nitrous oxide, as indicated at block 32, and generating a plasma in the chamber using a high frequency power setting ratio ranging from approximately 1.2–1.8, as indicated at block 34. This will result in a power density ranging from approximately 0.20–0.37 watts per square centimeter of shower head in the processing chamber.

The constituent chemicals that are used to form the layer of silicon oxynitride may be varied. In one illustrative embodiment, the constituent chemicals are comprised of silane ($SiH_4$), nitrous oxide ($N_2O$), and nitrogen ($N_2$). In one particularly illustrative example, the flow rate of the silane ranges from approximately 435–475 (455±20) standard cubic centimeters per minute (sccm), the flow rate of the nitrous oxide ($N_2O$) ranges from approximately 125–165 (145±20) sccm, and the flow rate of nitrogen ($N_2$) ranges from approximately 7500–8500 (8000±500) sccm. In another particularly illustrative embodiment, the constituent chemicals are comprised of approximately 455 sccm of silane, approximately 145 sccm of nitrous oxide, and approximately 8000 sccm of nitrogen. Other carrier gases, such as helium (He) or argon (Ar) may be used in lieu of nitrogen in connection with the present invention. However, flow rates of these alternative gases may vary from that described above with respect to nitrogen.

Other process parameters, of course, may be considered in the formation of silicon oxynitride layers in accordance with the present invention. For example, the pressure employed during the present process may range from approximately 2.7–3.3 (3±0.3) torr, and in one particular embodiment is approximately 3.0 torr. Similarly, the temperature at which the process disclosed herein may be performed ranges from approximately 380–420° C. (400±20° C.), and in one particular embodiment is approximately 400° C. Application of the power used to generate the plasma may also be delayed until a certain time after the silane has been introduced into the process chamber, e.g., a 1–2 second delay. Moreover, the wafer may be subjected to temperature soak for a duration ranging from approximately 15–45 seconds, and in one particular embodiment for a duration of approximately 30 seconds.

In one particular embodiment, the present invention is comprised of forming a silicon oxynitride layer using the following recipe: silane ($SiH_4$): 435–475-sccm; nitrogen ($N_2$): 7500–8500 sccm; nitrous oxide ($N_2O$): 125–165 sccm with a high frequency RF power (HFRF) setting ranging from approximately 510–610 watts, a low frequency RF power (LFRF) setting ranging from approximately 330–430 watts at a pressure ranging from approximately 2.7–3.3 torr, and at a temperature ranging from approximately 380–420° C. There may also be a delay time for introducing the silane prior to the application of the power to form a stable plasma of approximately 1–2 seconds. Additionally, a temperature soaking operation may be performed for a duration ranging from approximately 15–45 seconds to improve the uniformity of the resulting layer. The particular order of the introduction of the various process chemicals into the process chamber may be varied.

By producing silicon oxynitride layers in accordance with the present invention, better thickness control of the resulting layer may be achieved, e.g., on the order of 1% variation (1 sigma) as compared to the nominal thickness with deposition rates ranging from approximately 2350–2650 (2500±150) Å/minute. In contrast, the process described in U.S. patent application Ser. No. 08/924,130, now U.S. Pat. No. 6,060,404, entitled "In-situ Deposition of Stop Layer and Dielectric Layer During Formation of Local Interconnects," for forming layers of silicon oxynitride has deposition rates on the order of approximately 1000–1200

Å/minute and a thickness control on the order of 2% variation (1 sigma). Moreover, the recipe disclosed herein for forming silicon oxynitride layers reduces or eliminates the damage caused to gate dielectrics using some prior art processes. This, in turn, increases the reliability of the resulting devices and increases manufacturing yields. The present invention may be used to produce a silicon-rich layer of silicon oxynitride having a refractive index ranging from approximately 2.19–2.49, and in one particular embodiment, a refractive index of approximately 2.34.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a layer of silicon oxynitride above a wafer, comprising:

positioning said wafer in a process chamber;

introducing silane and nitrous oxide into said chamber at a flow rate ratio ranging from approximately 2.6–3.8 silane to nitrous oxide; and generating a plasma in said chamber using a high frequency to low frequency power setting ratio ranging from approximately 1.2–1.8.

2. The method of claim 1, wherein introducing silane and nitrous oxide into said chamber at a flow rate ratio ranging from approximately 2.6–3.8 silane to nitrous oxide comprises introducing approximately 435–475 standard cubic centimeters per minute of silane and approximately 125–165 standard cubic centimeters per minute of nitrous oxide into said chamber.

3. The method of claim 1, further comprising introducing approximately 7500–8500 standard cubic centimeters per minute of nitrogen into said chamber.

4. The method of claim 1, wherein generating a plasma in said chamber using a high frequency to low frequency power setting ratio ranging from approximately 1.2–1.8 comprises generating a plasma in said chamber using a high frequency power setting of approximately 510–610 watts and a low frequency power setting of approximately 330–430 watts.

5. The method of claim 1, further comprising maintaining a pressure in said chamber from approximately 2.7–3.3 Torr.

6. The method of claim 1, further comprising maintaining a temperature in said chamber ranging from approximately 380–420° C.

7. The method of claim 1, further comprising soaking said wafer in said chamber at a temperature ranging from approximately 380–420° C. for a duration ranging from approximately 15–45 seconds.

8. A method of forming a layer of silicon oxynitride above a wafer, comprising:

positioning said wafer in a process chamber;

introducing approximately 435–475-standard cubic centimeters per minute of silane and approximately 125–165 standard cubic centimeters per minute of nitrous oxide into said chamber; and generating a plasma in said chamber using a high frequency power setting of approximately 510–610 watts and a low frequency power setting of approximately 330–430 watts.

9. The method of claim 8, further comprising introducing approximately 7500–8500 standard cubic centimeters per minute of nitrogen into said chamber.

10. The method of claim 8, further comprising maintaining a pressure in said chamber from approximately 2.7–3.3 Torr.

11. The method of claim 8, further comprising maintaining a temperature in said chamber ranging from approximately 380–420° C.

12. The method of claim 8, further comprising soaking said wafer in said chamber at a temperature ranging from approximately 380–420° C. for a duration ranging from approximately 15–45 seconds.

13. A method of forming a layer of silicon oxynitride above a wafer, comprising:

positioning said wafer in a process chamber;

introducing approximately 435–475-standard cubic centimeters per minute of silane and approximately 125–165 standard cubic centimeters per minute of nitrous oxide and approximately 7500–8500 standard cubic centimeters per minute of nitrogen into said chamber;

generating a plasma in said chamber using a high frequency power setting of approximately 510–610 watts and a low frequency power setting of approximately 330–430 watts;

maintaining a pressure in said chamber from approximately 2.7–3.3 Torr; and maintaining a temperature in said chamber ranging from approximately 380–420° C.

14. The method of claim 13, further comprising soaking said wafer in said chamber at a temperature ranging from approximately 380–420° C. for a duration ranging from approximately 15–45 seconds.

* * * * *